(12) United States Patent
Krishnan et al.

(10) Patent No.: US 10,316,412 B2
(45) Date of Patent: Jun. 11, 2019

(54) WAFTER CARRIER FOR CHEMICAL VAPOR DEPOSITION SYSTEMS

(75) Inventors: Sandeep Krishnan, Plainview, NY (US); Jeffrey Scott Montgomery, Plainview, NY (US); Lukas Urban, Plainview, NY (US); Alexander I. Gurary, Plainview, NY (US); Yuliy Rashkovsky, Plainview, NY (US)

(73) Assignee: Veeco Instruments Inc., Plainview, NY (US)

( * ) Notice: Subject to any disclaimer, the term of this patent is extended or adjusted under 35 U.S.C. 154(b) by 1375 days.

(21) Appl. No.: 13/450,062

(22) Filed: Apr. 18, 2012

(65) Prior Publication Data

US 2013/0276704 A1    Oct. 24, 2013

(51) Int. Cl.
*C23C 16/458* (2006.01)
*H01L 21/687* (2006.01)

(52) U.S. Cl.
CPC ...... *C23C 16/4584* (2013.01); *C23C 16/4583* (2013.01); *H01L 21/6875* (2013.01); *H01L 21/68714* (2013.01); *H01L 21/68728* (2013.01); *H01L 21/68735* (2013.01); *Y10T 29/49826* (2015.01)

(58) Field of Classification Search
CPC ............. C23C 16/4584; C23C 16/4583; Y10T 29/49826; H01L 21/68728; H01L 21/68714; H01L 21/68735
See application file for complete search history.

(56) References Cited

U.S. PATENT DOCUMENTS

| 3,754,110 A | 8/1973 | van Dongen et al. |
| 3,892,940 A | 7/1975 | Bloem et al. |
| 3,993,018 A | 11/1976 | Kranik et al. |
| 4,512,841 A | 4/1985 | Cunningham, Jr. et al. |
| 4,898,639 A | 2/1990 | Moe et al. |

(Continued)

FOREIGN PATENT DOCUMENTS

| EP | 1 615 259 A1 | 1/2006 |
| EP | 1 720 200 A1 | 11/2006 |

(Continued)

OTHER PUBLICATIONS

Taiwanese Office Action for Taiwanese Application No. 103204332 dated Oct. 3, 2014. English translation not provided.

(Continued)

*Primary Examiner* — Yuechuan Yu
(74) *Attorney, Agent, or Firm* — Patterson Thuente Pedersen, P.A.

(57) ABSTRACT

A wafer carrier for use in a system for growing epitaxial layers on one or more wafers by chemical vapor deposition. The wafer carrier includes wafer retention pockets recessed in its body. Each pocket includes a floor surface and a peripheral wall surface surrounding the floor surface and defining a periphery of that pocket. Each pocket has a center situated along a corresponding wafer carrier radial axis. In each of the pockets, a set of bumpers is positioned primarily at a distal portion of the wafer retention pocket opposite the central axis so as to maintain a gap of at least a predefined size between the peripheral wall surface at the distal portion and an edge of a wafer to be placed in the wafer retention pocket.

32 Claims, 12 Drawing Sheets

(56) References Cited

U.S. PATENT DOCUMENTS

| | | |
|---|---|---|
| 5,119,541 A | 6/1992 | Ohmi et al. |
| 5,155,652 A | 10/1992 | Logan et al. |
| 5,195,729 A | 3/1993 | Thomas et al. |
| 5,242,501 A | 9/1993 | McDiarmid |
| 5,403,401 A | 4/1995 | Haafkens et al. |
| 5,531,835 A | 7/1996 | Fodor et al. |
| 5,556,476 A | 9/1996 | Lei et al. |
| 5,626,678 A | 5/1997 | Sahin et al. |
| 5,761,023 A | 6/1998 | Lue et al. |
| 5,800,622 A | 9/1998 | Takemi et al. |
| 5,820,686 A | 10/1998 | Moore |
| 5,837,058 A | 11/1998 | Chen et al. |
| 5,840,124 A | 11/1998 | Gurary et al. |
| 6,001,183 A | 12/1999 | Gurary et al. |
| 6,074,696 A | 6/2000 | Sato |
| 6,092,623 A | 7/2000 | Collavino |
| 6,126,382 A | 10/2000 | Scales et al. |
| 6,146,464 A | 11/2000 | Beinglass et al. |
| 6,188,838 B1 | 2/2001 | Mikata et al. |
| 6,287,386 B1 | 9/2001 | Perlov et al. |
| 6,375,741 B2 | 4/2002 | Reardon |
| 6,391,802 B1 | 5/2002 | Delpech et al. |
| 6,454,865 B1 | 9/2002 | Goodman et al. |
| 6,492,625 B1 | 12/2002 | Boguslayskiy et al. |
| 6,506,252 B2 | 1/2003 | Boguslayskiy et al. |
| 6,634,882 B2 | 10/2003 | Goodman |
| 6,685,774 B2 | 2/2004 | Boguslayskiy et al. |
| 6,726,769 B2 | 4/2004 | Boguslayskiy et al. |
| 6,729,875 B2 | 5/2004 | Goodman |
| 6,840,767 B2 | 1/2005 | Goodman |
| 6,902,623 B2 | 6/2005 | Gurary et al. |
| 7,070,660 B2 | 7/2006 | Keeton et al. |
| 7,235,139 B2 | 6/2007 | Boguslayskiy et al. |
| 7,256,375 B2 | 8/2007 | Oosterlaken |
| 7,276,124 B2 | 10/2007 | Gurary et al. |
| 7,279,048 B2 | 10/2007 | Shinma et al. |
| 7,331,780 B2 | 2/2008 | Adachi |
| D600,221 S | 9/2009 | Sato |
| D600,222 S | 9/2009 | Sato |
| 7,601,224 B2 | 10/2009 | Foree |
| 7,625,205 B2 | 12/2009 | Sasmjima et al. |
| 7,959,735 B2 | 6/2011 | Sterling et al. |
| 8,021,487 B2 | 9/2011 | Boguslayskiy et al. |
| 8,092,599 B2 | 1/2012 | Sferlazzo et al. |
| 8,372,204 B2 | 2/2013 | Nakamura et al. |
| 9,017,483 B2 | 4/2015 | Fujikawa et al. |
| 2002/0018506 A1 | 2/2002 | Vogler |
| 2002/0106826 A1 | 8/2002 | Boguslayskiy et al. |
| 2002/0185062 A1 | 12/2002 | Halpin |
| 2002/0197144 A1 | 12/2002 | Blank et al. |
| 2003/0089457 A1 | 5/2003 | Nallan et al. |
| 2004/0011293 A1* | 1/2004 | Johnson et al. ............ 118/728 |
| 2004/0011780 A1 | 1/2004 | Sun et al. |
| 2004/0187790 A1 | 9/2004 | Bader et al. |
| 2005/0051099 A1 | 3/2005 | Preti et al. |
| 2006/0076108 A1 | 4/2006 | Holland et al. |
| 2006/0115968 A1 | 6/2006 | Funk |
| 2006/0180076 A1 | 8/2006 | Kanaya et al. |
| 2006/0191483 A1 | 8/2006 | Blomiley et al. |
| 2006/0245906 A1 | 11/2006 | Pelzmann et al. |
| 2007/0026148 A1 | 2/2007 | Arai et al. |
| 2007/0186853 A1 | 8/2007 | Gurary et al. |
| 2007/0218664 A1* | 9/2007 | Ito et al. .................... 438/565 |
| 2008/0124470 A1 | 5/2008 | Van Den Berg et al. |
| 2009/0155028 A1 | 6/2009 | Boguslayskiy et al. |
| 2009/0162952 A1 | 6/2009 | Liu et al. |
| 2010/0055318 A1 | 3/2010 | Volf et al. |
| 2010/0116210 A1 | 5/2010 | Kato et al. |
| 2010/0282170 A1 | 11/2010 | Nishizawa |
| 2011/0049779 A1 | 3/2011 | Egami et al. |
| 2011/0129947 A1 | 6/2011 | Mangum et al. |
| 2011/0206843 A1 | 8/2011 | Gurary et al. |
| 2012/0040097 A1 | 2/2012 | Volf et al. |
| 2012/0309191 A1 | 12/2012 | Miura |
| 2013/0065403 A1 | 3/2013 | Paranjpe et al. |
| 2013/0092595 A1 | 4/2013 | Chang et al. |
| 2013/0186113 A1 | 7/2013 | Chung et al. |
| 2013/0276704 A1 | 10/2013 | Krishnan et al. |
| 2014/0261187 A1 | 9/2014 | Krishnan et al. |
| 2014/0287142 A1 | 9/2014 | Boyd et al. |
| 2014/0360430 A1 | 12/2014 | Armour et al. |
| 2015/0118009 A1 | 4/2015 | Hsieh et al. |

FOREIGN PATENT DOCUMENTS

| | | |
|---|---|---|
| EP | 1965412 | 9/2008 |
| EP | 708477 | 1/2013 |
| JP | 60-173852 A | 9/1985 |
| JP | S63-096912 A | 4/1988 |
| JP | 01-256118 A | 10/1989 |
| JP | 04-123265 A | 4/1992 |
| JP | 05029230 | 2/1993 |
| JP | H5-275355 A | 10/1993 |
| JP | 5-335253 A | 12/1993 |
| JP | 6-010140 A | 1/1994 |
| JP | 7-074114 A | 3/1995 |
| JP | 10-060674 A | 3/1998 |
| JP | 10-087394 A | 4/1998 |
| JP | 10144758 A * | 5/1998 |
| JP | 10-167885 A | 6/1998 |
| JP | 10-167886 A | 6/1998 |
| JP | 2000-355766 A | 12/2000 |
| JP | 2001-126995 A | 5/2001 |
| JP | 2003-037071 A | 2/2003 |
| JP | 2004-128271 A | 4/2004 |
| JP | 2004-327761 A | 11/2004 |
| JP | 2005-136025 A | 5/2005 |
| JP | 2005232488 | 9/2005 |
| JP | 2007-251078 A | 9/2007 |
| JP | 2009088088 A * | 4/2009 |
| JP | 2010028013 A * | 2/2010 |
| KR | 10-2007-0019689 A | 2/2007 |
| KR | 10-2012-0090676 A | 8/2012 |
| WO | WO0107691 | 2/2001 |
| WO | WO 2005/081298 A1 | 9/2005 |
| WO | WO 2006/088448 A1 | 8/2006 |
| WO | WO 2007/105877 A1 | 9/2007 |
| WO | WO 2007/122147 A1 | 11/2007 |
| WO | WO2014062000 | 4/2014 |
| WO | WO2014062002 | 4/2014 |

OTHER PUBLICATIONS

International Search Report and Written Opinion for International Application No. PCT/US2014/027773 dated Jul. 28, 2014.
EP Application No. 14762924.0, Partial Supplementary European Search Report dated Oct. 17, 2016, 7 pages.
EP Application No. 14762924.0, Extended European Search Report dated Feb. 17, 2017, 12 pages.
CN Application No. 201480015658.8, First Office Action, dated Apr. 1, 2017, 13 pages.
TW Application No. 103109201, Office Action, dated Aug. 28, 2017, 4 pages.
Application and File History for U.S. Appl. No. 13/840,164, filed Mar. 15, 2013, Inventors Krishnan et al.
Application and File History for U.S. Appl. No. 12/549,768, filed Apr. 18, 2012, Inventors Krishnan et al.
European Application No. 12193897.1, European Extended Search Report dated Septemer 15, 2016.
European Application No. 121938989, European Extended Search Report dated Dec. 13, 2012.
European Application No. 09810392, Supplemental Search Report dated Apr. 5, 2012.
U.S. Appl. No. 61/237,948, filed Aug. 28, 2009, Egami et al.
Int'l Application No. PCT/US09/04931 Search Report dated Apr. 15, 2010.

* cited by examiner

Section 3-3

WAFTER CARRIER FOR CHEMICAL VAPOR DEPOSITION SYSTEMS

FIELD OF THE INVENTION

The invention relates generally to semiconductor fabrication technology and, more particularly, to chemical vapor deposition (CVD) processing and associated apparatus for reducing temperature non-uniformities on semiconductor wafer surfaces.

BACKGROUND OF THE INVENTION

In the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. A CVD tool includes a process chamber, which is a sealed environment that allows infused gases to be deposited upon the substrate (typically in the form of wafers) to grow the thin film layers. An example of a current product line of such manufacturing equipment is the TurboDisc® family of MOCVD systems, manufactured by Veeco Instruments Inc. of Plainview, N.Y.

A number of process parameters are controlled, such as temperature, pressure and gas flow rate, to achieve a desired crystal growth. Different layers are grown using varying materials and process parameters. For example, devices formed from compound semiconductors such as III-V semiconductors typically are formed by growing successive layers of the compound semiconductor using metal organic chemical vapor deposition (MOCVD). In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo-gallium compound and ammonia on a substrate having a suitable crystal lattice spacing, as for example, a sapphire wafer. Typically, the wafer is maintained at a temperature on the order of 1000-1100° C. during deposition of gallium nitride and related compounds.

In a MOCVD process, where the growth of crystals occurs by chemical reaction on the surface of the substrate, the process parameters must be controlled with particular care to ensure that the chemical reaction proceeds under the required conditions. Even small variations in process conditions can adversely affect device quality and production yield. For instance, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary to an unacceptable degree.

In a MOCVD process chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed. Typically, the wafers are supported in spaced relationship to the bottom surface of each of the pockets to permit the flow of gas around the edges of the wafer. Some examples of pertinent technology are described in U.S. Patent Application Publication No. 2012/0040097, U.S. Pat. Nos. 8,092,599, 8,021,487, U.S. Patent Application Publication No. 2007/0186853, U.S. Pat. Nos. 6,902,623, 6,506,252, and 6,492,625, the disclosures of which are incorporated by reference herein.

The wafer carrier is supported on a spindle within the reaction chamber so that the top surface of the wafer carrier having the exposed surfaces of the wafers faces upwardly toward a gas distribution device. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

The gas flow over the wafers varies depending on the radial position of each wafer, with outermost-positioned wafers being subjected to higher flow rates due to their faster velocity during rotation. Even on each individual wafer there can be temperature non-uniformities, i.e., cold spots and hot spots.

A great deal of effort has been devoted to system design features to minimize temperature variations during processing; however, the problem continues to present many challenges. For instance, as the wafer carrier is rotated, the wafers are subjected to substantial centripetal force, which tends to press the outer edge of each wafer that is facing away from the axis of rotation against the interior wall of the respective pocket in the wafer carrier. Under this condition, there is no gas flow around these outer edges of the wafers, and there is increased heat conduction to these outer-most portions of the wafers, resulting in more temperature non-uniformity and further aggravating the problems described above.

SUMMARY OF THE INVENTION

Aspects of the invention are directed to a chemical vapor deposition (CVD) system in which thermal non-uniformities along the edges of the wafers are significantly reduced. In one aspect, a wafer carrier has a body formed symmetrically about a central axis, and including a generally planar top surface that is situated perpendicularly to the central axis. A plurality of wafer retention pockets are recessed in the body from the top surface. Each of the wafer retention pockets includes a floor surface generally parallel to the top surface;

and a peripheral wall surface surrounding the floor surface and defining a periphery of that wafer retention pocket. Each wafer retention pocket has a pocket center situated along a corresponding wafer carrier radial axis that is perpendicular to the central axis.

In each of the wafer retention pockets, a set of bumpers positioned primarily at a distal portion of the wafer retention pocket opposite the central axis so as to maintain a gap of at least a predefined size between the peripheral wall surface at the distal portion and an edge of a wafer to be placed in the wafer retention pocket such that the bumpers of each set of bumpers have a variety configurations so that the predefined size of the gap at various bumper positions is different.

In one type of embodiment, each of the bumpers protrudes from the peripheral wall surface generally toward the pocket center. In another type of embodiment, in each set of bumpers of each wafer retention pocket, the bumpers positioned relatively more distally opposite the central axis are configured to provide a relatively larger predefined size of the gap.

In another aspect of the invention, a method is provided for forming the wafer carrier. In the method, a wafer carrier body is formed that is symmetric about a central axis. A generally planar top surface is formed in the body that is situated perpendicularly to the central axis. A plurality of wafer retention pockets is formed, with each of the pockets recessed in the body from the top surface. In the pockets, a floor surface is generally parallel to the top surface; and a peripheral wall surface surrounds the floor surface and defines a periphery of that wafer retention pocket. Each wafer retention pocket is formed such that it has a pocket center situated along a corresponding wafer carrier radial axis that is perpendicular to the central axis.

The method further comprises arranging a set of bumpers positioned primarily at a distal portion of the wafer retention pocket opposite the central axis so as to maintain a gap of at least a predefined size between the peripheral wall surface at the distal portion and an edge of a wafer to be placed in the wafer retention pocket such that the bumpers of each set of bumpers have a variety configurations so that the predefined size of the gap at various bumper positions is different.

In another aspect of the invention, a wafer carrier includes a body formed symmetrically about a central axis, and includes a generally planar top surface that is situated perpendicularly to the central axis, and a plurality of wafer retention pockets recessed in the body from the top surface. Each of the wafer retention pockets includes a floor surface generally parallel to the top surface and a peripheral wall surface surrounding the floor surface defining a periphery of that wafer retention pocket. Each wafer retention pocket has a pocket center situated along a corresponding wafer carrier radial axis that is perpendicular to the central axis.

In each of the wafer retention pockets, a set of bumpers is positioned primarily at a distal portion of the wafer retention pocket opposite the central axis so as to maintain a gap of at least a predefined size between the peripheral wall surface at the distal portion and an edge of a wafer to be placed in the wafer retention pocket. Each of the bumpers in each of the wafer retention pockets includes an interface surface that faces inward towards the pocket center and is adapted to contact the corresponding peripheral edge of a wafer during operation of the system for growing epitaxial layers. The interface surface includes an inwardly sloping portion having a top end that protrudes inward further than a bottom end of the interface surface. The interface surface of each of the bumpers includes a contact portion that is positioned to be a sole contact surface against the peripheral edge of the wafer during operation such that a centripetal force applied to the wafer has substantially only a horizontal component.

In related aspects of the invention, the wafer carrier is part of an apparatus for growing epitaxial layers on one or more wafers by chemical vapor deposition that includes a reaction chamber, a rotatable spindle having an upper end disposed inside the reaction chamber, where the wafer carrier is centrally and detachably mounted on an upper end of the spindle and is in contact therewith at least in the course of a CVD process.

Advantageously, the minimal gap provides better uniformity in the thermal distribution of the surface of a wafer being processed in a CVD process. A number of other advantages will become apparent from the following Detailed Description.

BRIEF DESCRIPTION OF THE DRAWINGS

The invention may be more completely understood in consideration of the following detailed description of various embodiments of the invention in connection with the accompanying drawings, in which:

FIGS. 15A-15C are top-view diagrams illustrating various peripheral surface profiles that can be used for bumpers according to various embodiments.

Figure 1:
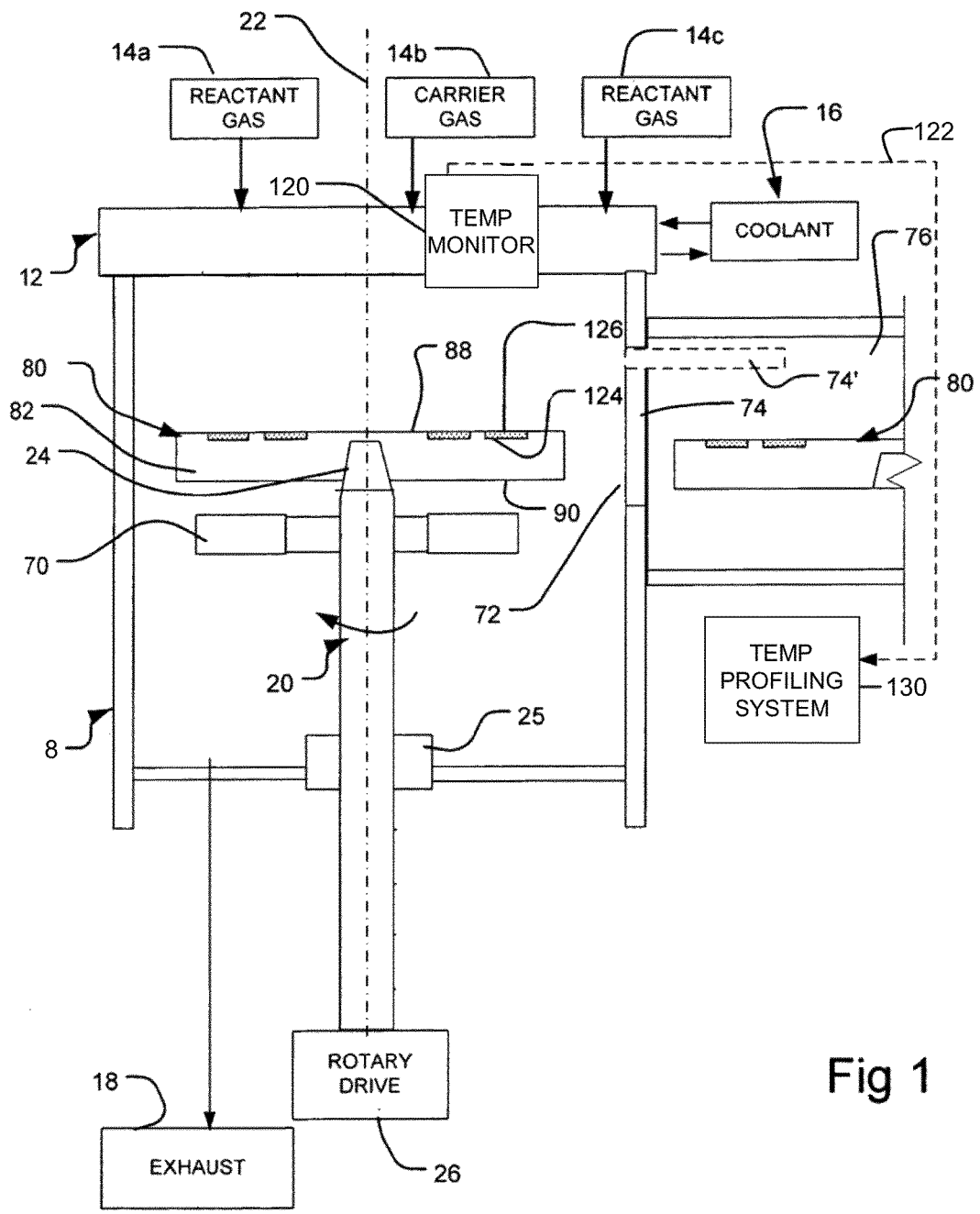
FIG. 1 illustrates a chemical vapor deposition apparatus in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 illustrates a chemical vapor deposition apparatus in accordance with one embodiment of the invention. A reaction chamber 8 defines a process environment space. A gas distribution device 12 is arranged at one end of the chamber. The end having the gas distribution device 12 is referred to herein as the "top" end of the chamber 8. This end of the chamber typically, but not necessarily, is disposed at the top of the chamber in the normal gravitational frame of reference. Thus, the downward direction as used herein refers to the direction away from the gas distribution device 12; whereas the upward direction refers to the direction within the chamber, toward the gas distribution device 12, regardless of whether these directions are aligned with the gravitational upward and downward directions. Similarly, the "top" and "bottom" surfaces of elements are described herein with reference to the frame of reference of chamber 8 and gas distribution device 12.

Gas distribution device 12 is connected to sources 14a, 14b, 14c for supplying process gases to be used in the wafer treatment process, such as a carrier gas and reactant gases such as a metalorganic compound and a source of a group V metal. The gas distribution device 12 is arranged to receive the various gases and direct a flow of process gasses generally in the downward direction. The gas distribution device 12 desirably is also connected to a coolant system 16 arranged to circulate a liquid through the gas distribution device so as to maintain the temperature of the gas distribution device at a desired temperature during operation. A similar coolant arrangement (not shown) can be provided for cooling the walls of chamber 8. Chamber 8 is also equipped with an exhaust system 18 arranged to remove spent gases from the interior of the chamber through ports (not shown) at or near the bottom of the chamber so as to permit continuous flow of gas in the downward direction from the gas distribution device.

A spindle 20 is arranged within the chamber so that the central axis 22 of the spindle extends in the upward and downward directions. The spindle is mounted to the chamber by a conventional rotary pass-through device 25 incorporating bearings and seals (not shown) so that the spindle can rotate about axis 22, while maintaining a seal between the spindle and the wall of chamber 8. The spindle has a fitting 24 at its top end, i.e., at the end of the spindle closest to the gas distribution device 12. As further discussed below, fitting 24 is an example of a wafer carrier retention mechanism adapted to releasably engage a wafer carrier. In the particular embodiment depicted, the fitting 24 is a generally frustoconical element tapering toward the top end of the spindle and terminating at a flat top surface. A frustoconical element is an element having the shape of a frustum of a cone. Spindle 20 is connected to a rotary drive mechanism 26 such as an electric motor drive, which is arranged to rotate the spindle about axis 22.

A heating element 70 is mounted within the chamber and surrounds spindle 20 below fitting 24. The chamber is also provided with an entry opening 72 leading to an antechamber 76, and a door 74 for closing and opening the entry opening. Door 74 is depicted only schematically in FIG. 1. and is shown as movable between the closed position shown in solid lines, in which the door isolates the interior of chamber 8 from antechamber 76, and an open position shown in broken lines at 74'. The door 74 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus depicted in FIG. 1 may further include a loading mechanism (not shown) capable of moving a wafer carrier from the antechamber 76 into the chamber and engaging the wafer carrier with the spindle in the operative condition, and also capable of moving a wafer carrier off of the spindle and into antechamber 76.

Figure 2:
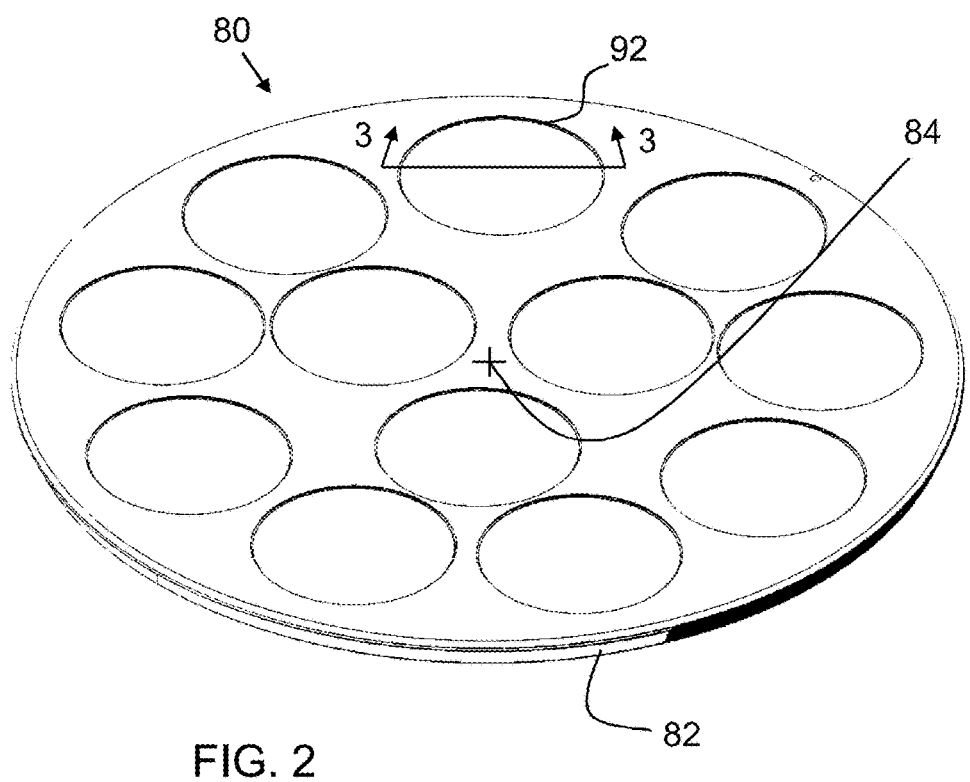
FIG. 2 is a perspective view diagram illustrating a wafer carrier used with the apparatus of FIG. 1 according to one embodiment of the invention.

The apparatus also includes a plurality of wafer carriers 80. In the operating condition shown in FIG. 1, a first wafer carrier 80 is disposed inside chamber 8 in an operative position, whereas a second wafer carrier 80 is disposed within antechamber 76. Each wafer carrier 80 includes a body 82 which is substantially in the form of a circular disc having a central axis 84 (FIG. 2). The body 82 is formed symmetrically about central axis 84. In the operative position the central axis 84 of the wafer carrier body is coincident with the axis 22 of the spindle. The body 82 may be formed as a single piece or as a composite of plural pieces. For example, as disclosed in U.S. Patent Application Pub. No. 20090155028, the disclosure of which is hereby incorporated by reference herein, the wafer carrier body may include a hub defining a small region of the body surrounding the central axis 84 and a larger portion defining the remainder of the disc-like body. The body desirably is formed from materials which do not contaminate the process and which can withstand the temperatures encountered in the process. For example, the larger portion of the disc may be formed largely or entirely from materials such as graphite, silicon carbide, or other refractory materials. The body has a generally planar top surface 88 and a bottom surface 90 extending generally parallel to one another and generally perpendicular to the central axis 84 of the disc. The body also has one, or a plurality, of wafer-holding features adapted to hold a plurality of wafers.

In operation, a wafer 124, such as a disc-like wafer formed from sapphire, silicon carbide, or other crystalline substrate, is disposed within each pocket 90 of each wafer carrier 80. Typically, the wafer 124 has a thickness which is small in comparison to the dimensions of its major surfaces. For example, a circular wafer of about 2 inches (50 mm) in diameter may be about 430 μm thick or less. As illustrated in FIG. 1, the wafer is disposed with a top surface 126 facing upwardly, so that the top surface is exposed at the top of the wafer carrier. It should be noted that in various embodiments, wafer carrier 80 carries different quantities of wafers. For instance, in one example embodiment, the wafer carrier is adapted to hold six wafers. In another example embodiment, as shown in FIG. 2, wafer carrier 80 holds 12 wafers.

In a typical MOCVD process, a wafer carrier 80 with wafers loaded thereon is loaded from antechamber 76 into chamber 8 and placed in the operative position shown in FIG. 1. In this condition, the top surfaces of the wafers face upwardly, towards the gas inlet structure 12. Heater 70 is actuated, and the rotary drive mechanism 26 operates to turn spindle 20 and hence wafer carrier 80 around axis 22. Typically, the spindle is rotated at a rotational speed from about 50-1500 revolutions per minute. Process gas supply units 14a, 14b, and 14c are actuated to supply gases through the gas distribution device 12. The gases pass downwardly toward the wafer carrier 80, over the top surface 88 of the wafer carrier and the top surfaces 126 of the wafers, and downwardly around the periphery of the wafer carrier to the outlet and to exhaust system 18. Thus, the top surface of the wafer carrier and the top surfaces of the wafer are exposed to a process gas including a mixture of the various gases supplied by the various process gas supply units. Most typically, the process gas at the top surface is predominantly composed of the carrier gas supplied by carrier gas supply unit 14b. In a typical chemical vapor deposition process, the carrier gas may be nitrogen, and hence the process gas at the top surface of the wafer carrier is predominantly composed of nitrogen with some amount of the reactive gas components.

Heaters 70 transfer heat to the bottom surface 90 of the wafer carrier, principally by radiant heat transfer. The heat applied to the bottom surface of the wafer carrier flows upwardly through the body 82 of the wafer carrier to the top surface 88 of the wafer carrier. Heat passing upwardly through the body also passes upwardly through gaps to the bottom surface of each wafer, and upwardly through the wafer to the top surface 126 of the wafer. Heat is radiated from the top surface 88 of the wafer carrier and from the top surfaces 126 of the wafer to the colder elements of the process chamber as, for example, to the walls of the process chamber and to the gas distribution device 12. Heat is also transferred from the top surface 88 of the wafer carrier and the top surfaces 126 of the wafers to the process gas passing over these surfaces.

In the embodiment depicted, the system includes a number of features designed to determine uniformity of heating of the surfaces 126 of each wafer 124. In this embodiment, temperature profiling system 130 receives temperature information 122 that can include a temperature and temperature monitoring positional information from temperature monitor 120. In addition, temperature profiling system 130 receives wafer carrier positional information, which in one embodiment can come from rotary drive mechanism 26. With this information, temperature profiling system 130 constructs a temperature profile of the wafers 124 on wafer carrier 80. The temperature profile represents a thermal distribution on the surface 126 of each of the wafers 124.

Figure 3:
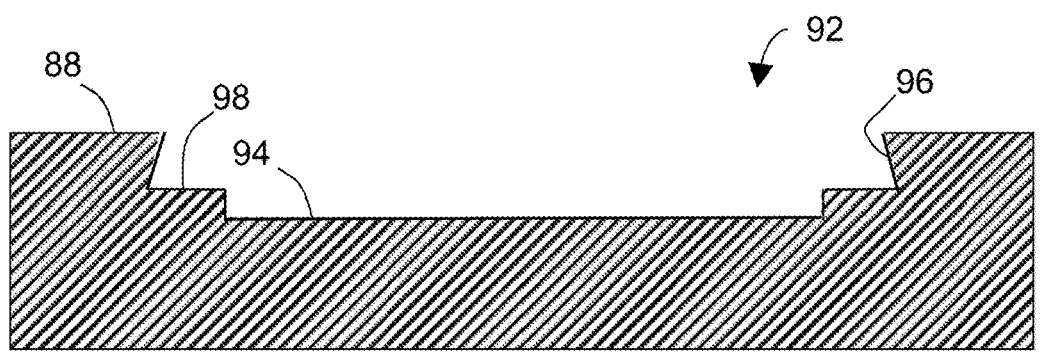
FIG. 3 is a cross-sectional view diagram taken along line 3-3 detailing a wafer retention site, also referred to herein as a wafer pocket, of the wafer carrier depicted in FIGS. 1 and 2.

FIGS. 2 and 3 illustrate wafer carrier 80 in greater detail. Each wafer retention site is in the form of a generally circular recess, or pocket 92 extending downwardly into the body from the top surface 88. The generally circular shape is made to correspond to the shape of the wafers. Each pocket 92 has a floor surface 94 disposed below the surrounding portions of the top surface 88. Each pocket also has a peripheral wall surface 96 surrounding the floor surface and defining the periphery of the pocket. The peripheral wall surface 96 extends downwardly from the top surface 88 of the body to the floor surface. In various embodiments, as depicted in particular in FIG. 3, the peripheral wall surface 96 has an undercut where the wall slopes inwards, towards the center of the pocket, over at least a portion of the periphery. Thus, the peripheral wall surface 96 forms an acute angle relative to floor surface 94. In one example embodiment, the angle formed between peripheral wall surface 96 and floor surface 94 is 80 degrees.

In a related embodiment (not shown) portions of the peripheral wall surface 96 have varying degrees of sloping. For instance, in one such embodiment, those portions of peripheral wall surface 96 that are furthest from the central axis 84 of the wafer carrier have a more acute angle.

In another related embodiment, as illustrated in FIG. 3, the floor surface 94 includes standoff features, such as tabs 98 located in certain locations along the periphery of each pocket 92. Tabs 98 raise the wafer off of floor surface 94, thereby permitting some flow of gas around the edges and below the bottom surface of the wafers.

Figure 4:
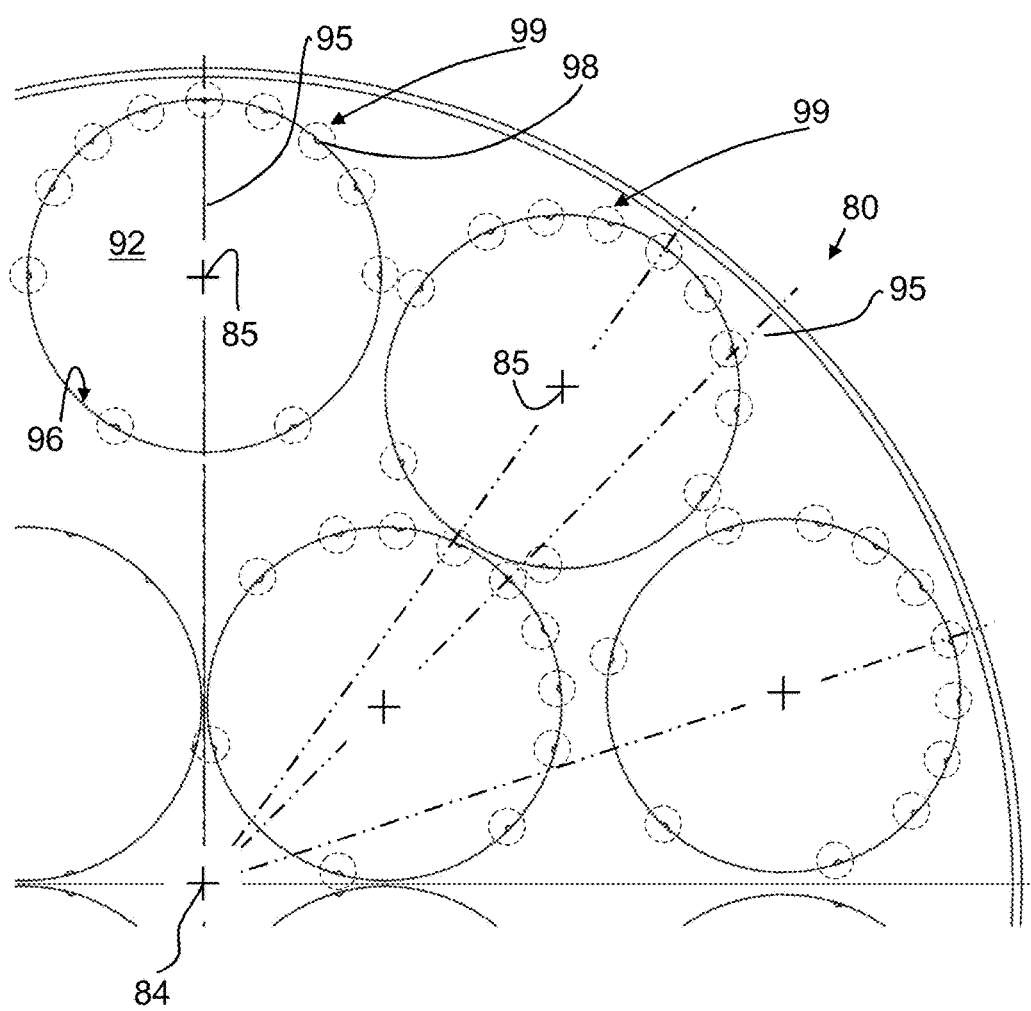
FIG. 4 is a partial plan view diagram illustrating additional details of the wafer pockets in the wafer carrier according to one embodiment.

FIG. 4 is a partial plan view diagram illustrating additional details of pockets 92 in wafer carrier 80, including the tab locations 99 of tabs 98 according to one embodiment. Each pocket 92 has a center 85 that is situated along a corresponding wafer carrier radial axis 95 that has an origin at central axis 84. Along peripheral wall surface 96 of each pocket 92 are situated a set of tabs 98. Each set of tabs 98 are arranged at tab locations 99 shown as dashed circles around each tab 98. For each pocket 92 tab locations 99 are arranged relative to that pocket's corresponding wafer carrier radial axis 95. As depicted in the embodiment of FIG. 4, the tab locations 99 are situated symmetrically about each wafer carrier radial axis 95, although in various other embodiments, tab locations 99 may be asymmetrically arranged.

Figure 5:
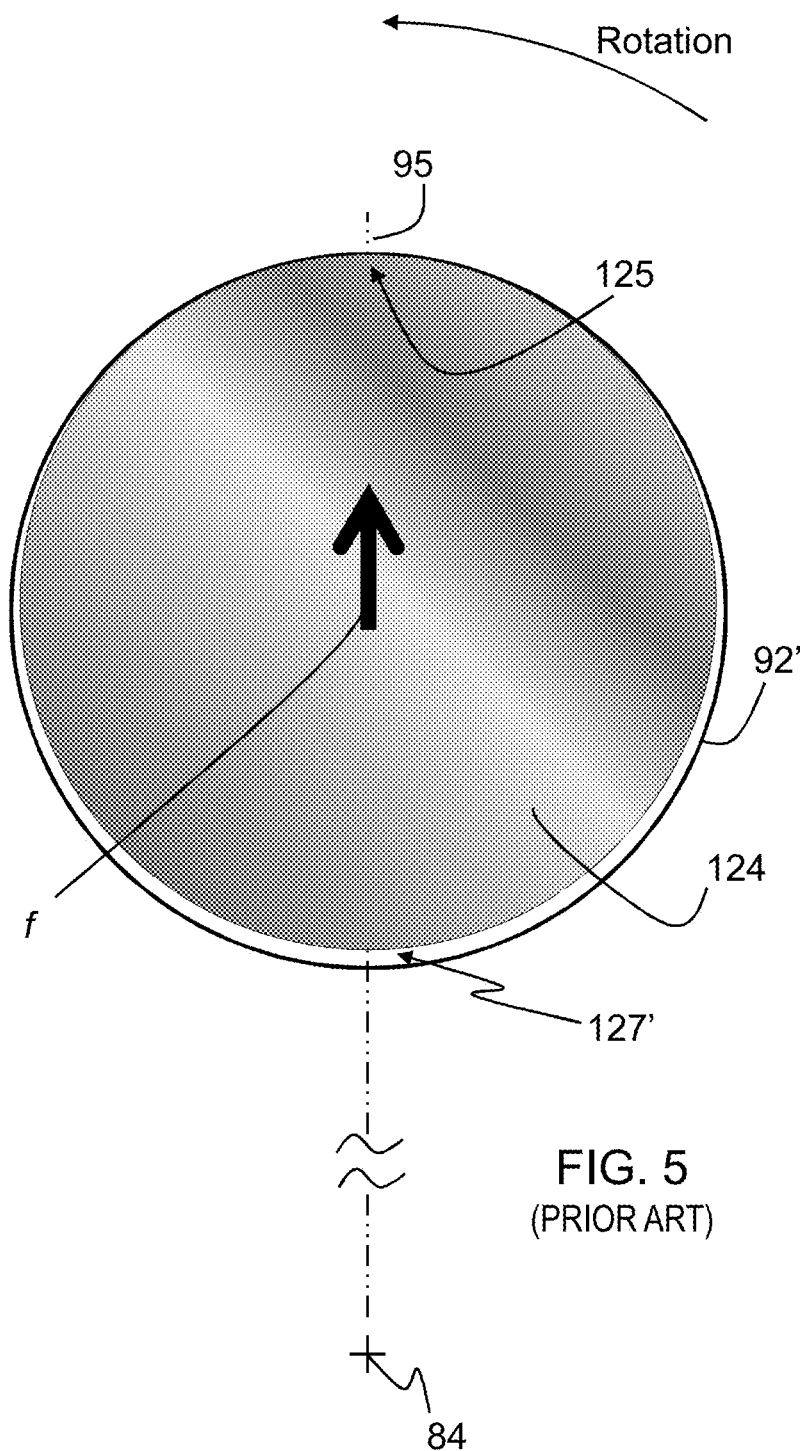
FIG. 5 is a plan view diagram of a wafer situated in a conventional pocket while the wafer carrier is rotating, where an uneven gap between an outer edge of the wafer and an interior peripheral wall of the wafer pocket exists.

When wafer carrier 80 is rotating, each wafer in its corresponding wafer pocket 92 exerts a reactive centrifugal force outwardly along its corresponding wafer carrier radial axis 95 in response to the centripetal force applied to the wafer by the outer-most portion of peripheral wall surface 96. FIG. 5 is a plan view diagram of a wafer 124 situated in a conventional pocket 92' while the wafer carrier is rotating as shown. The reactive centrifugal force is indicated with the arrow marked f that is pointing outwardly from central axis 84 along wafer carrier radial axis 95. As a result, an increased sized gap 127' is created on the interior end, and wafer 124 presses against the interior wall of the pocket 92 at the outer end 125. This situation creates temperature non-uniformities, with the outer end 125 being subjected generally to increased localized temperatures, i.e., hot spots.

Figure 6:
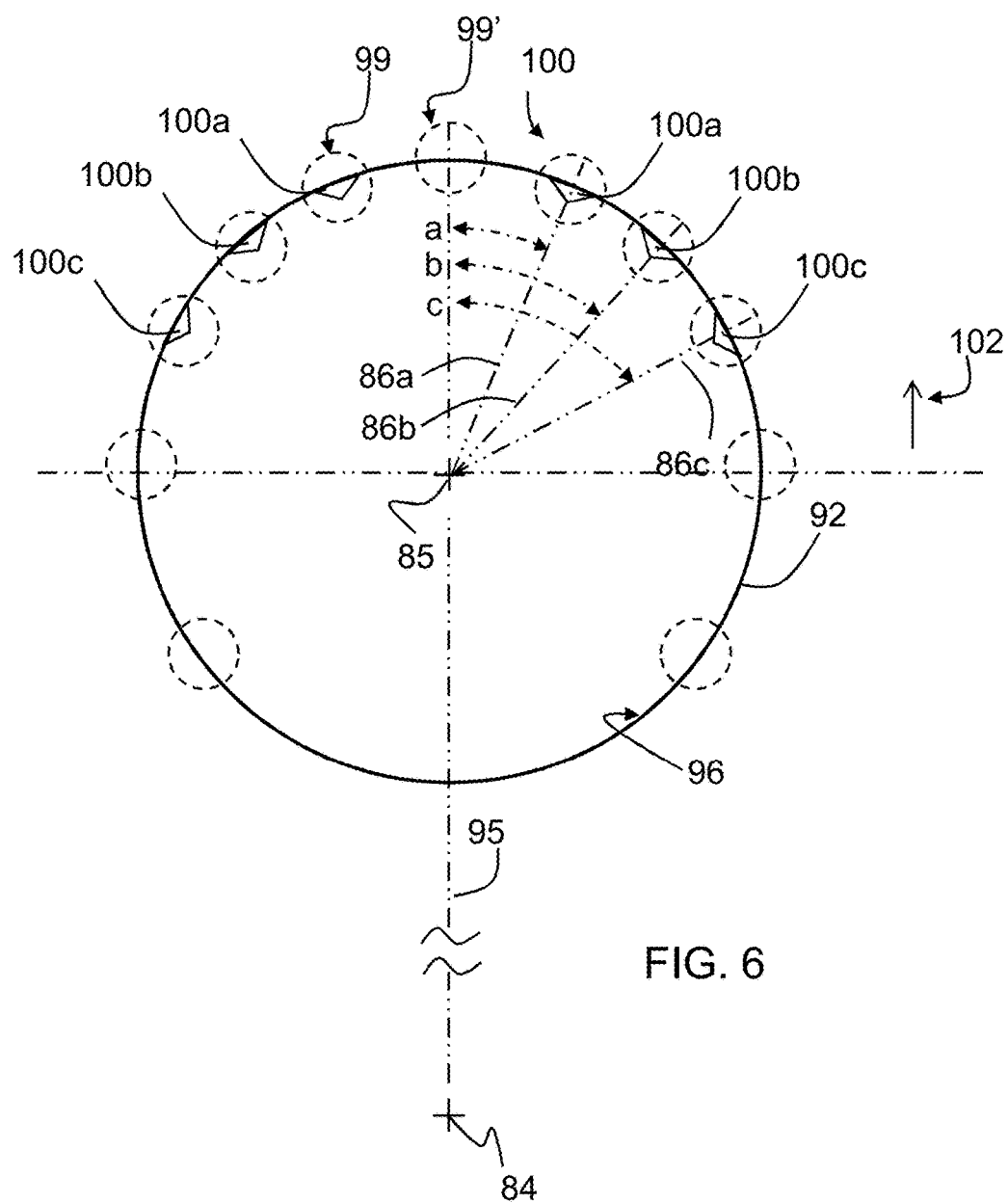
FIG. 6 is a schematic view diagram illustrating additional structural detail of a wafer pocket according to one embodiment, where a plurality of bumpers is formed.
Figure 9:
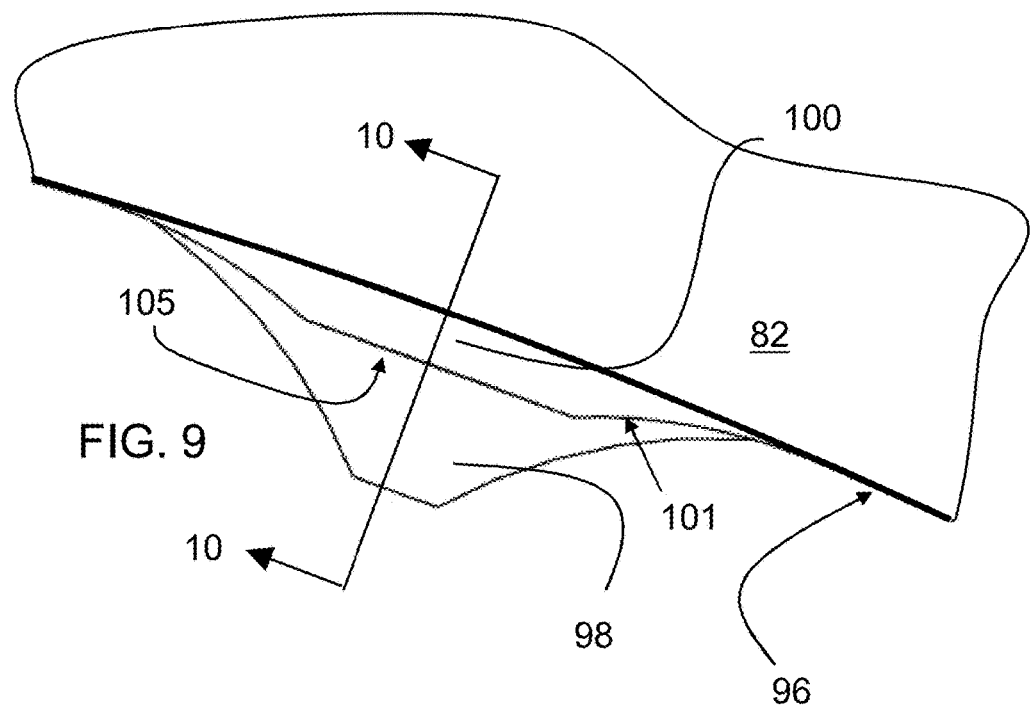
FIG. 9 is a plan view diagram illustrating details of a bumper and tab according to one particular embodiment.
Figure 10:
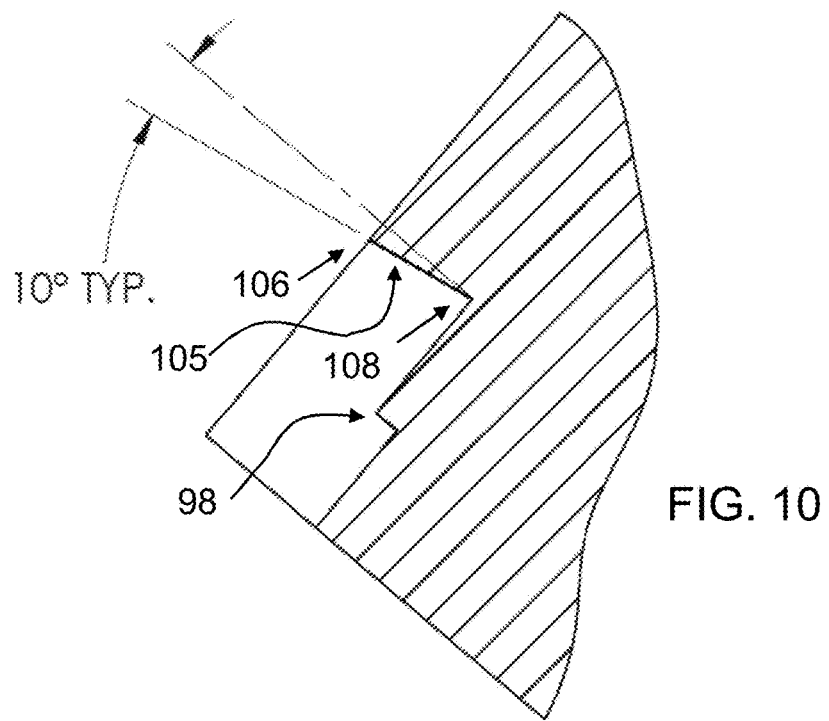
FIG. 10 is a cross-sectional view of the exemplary structure depicted in FIG. 9.
Figure 11:
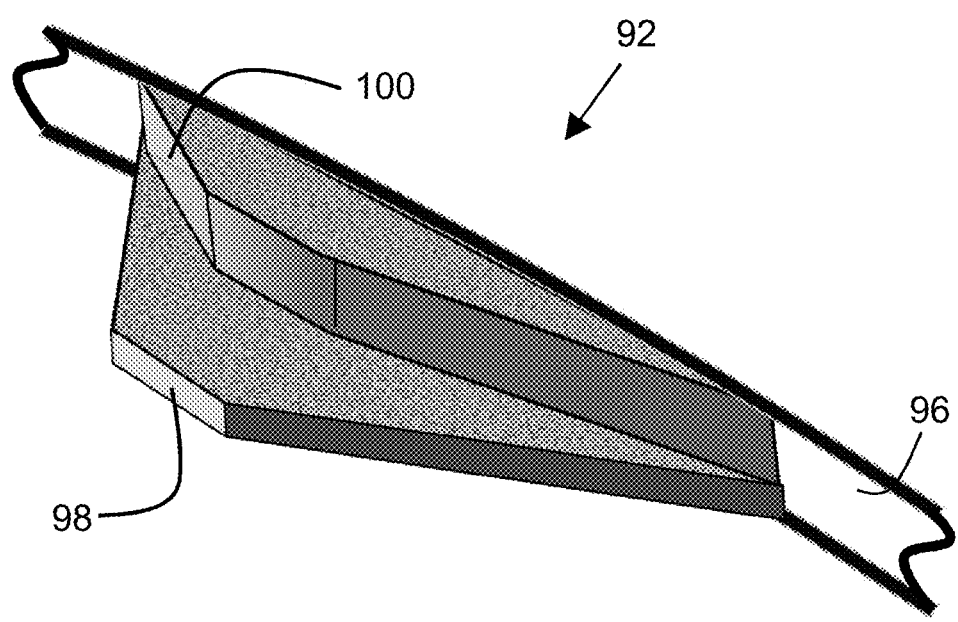
FIG. 11 is a perspective view diagram illustrating the interior of a wafer pocket with an inward protruding bumper and tab according to one embodiment.

FIG. 6 is a schematic view diagram illustrating additional structural detail of wafer pocket 92 according to one embodiment. As shown, wafer pocket 92 has a plurality of inward-pointing protrusions, generally referred to herein as bumpers 100, from peripheral wall surface 96. FIG. 6 shows relative locations of bumpers 100, whereas FIGS. 9-11 illustrate a general shape of bumper 100 according to one type of embodiment.

Figure 7:
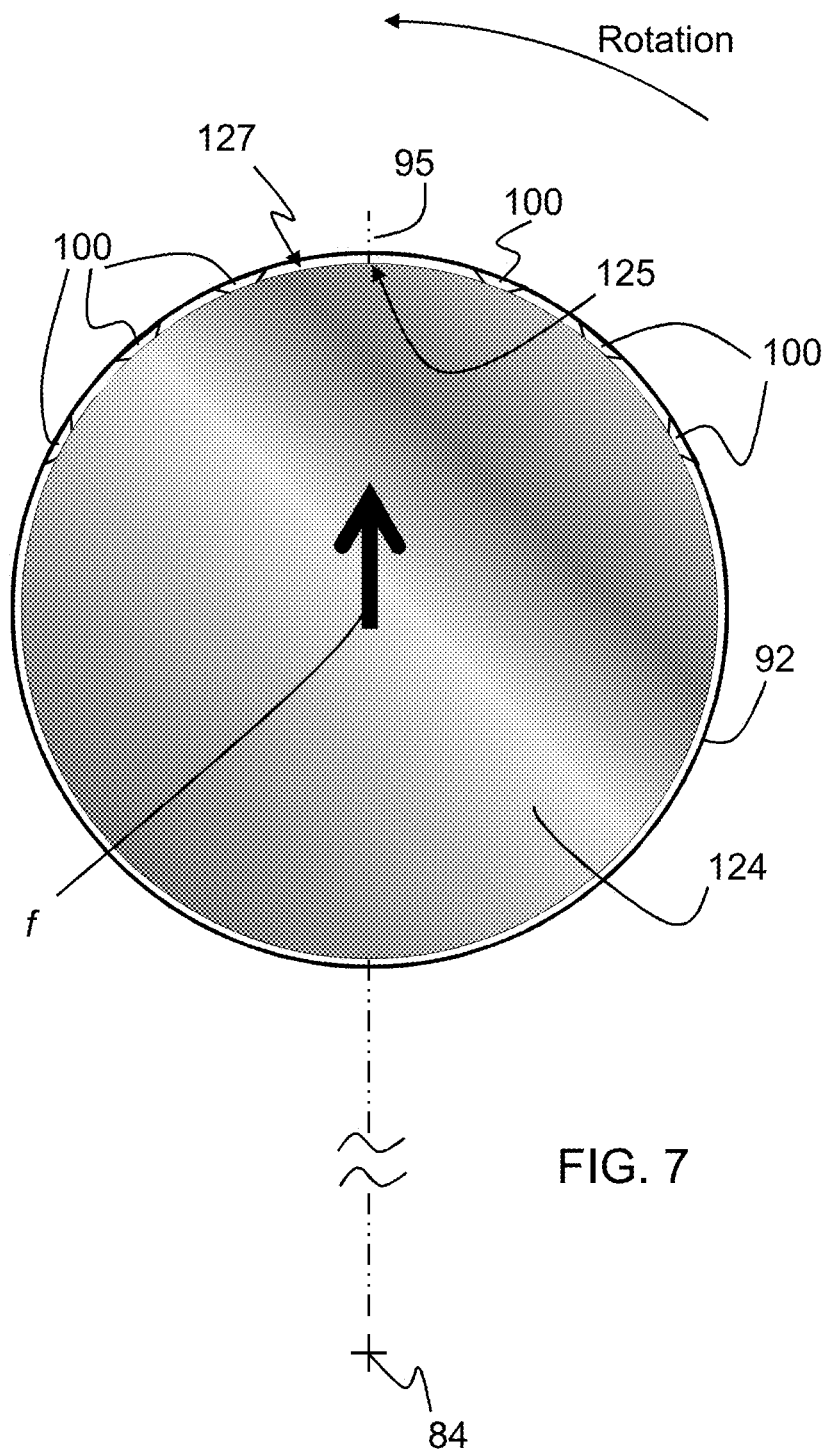
FIG. 7 is a plan-view diagram illustrating a wafer placed in a pocket that has a set of bumpers according to one embodiment.

FIG. 7 is a plan-view diagram illustrating a wafer 124 placed in pocket 92 that has a set of bumpers 100. In operation, as depicted, the rotation subjects wafer 124 to a centripetal force towards central axis 84 (thereby exerting a reactive centrifugal force f on the outer end 125 of the wafer pocket 92). However, unlike the conventional wafer pocket 92' described above in FIG. 5, the set of bumpers 100 of wafer pocket 92 maintain a certain minimum size of gap 127 around practically the entire wafer 124. It should be noted that the bumpers 100 actually contact the outer edge of wafer 124; thus, the gap 127 is not continuous. For practical purposes, however, given the relative length of the circumference wafer 124 and the size of the contact interfaces between bumpers 100 and the edge of wafer 124, the breaks in gap 124 corresponding to the contact interfaces is insubstantial in this type of embodiment.

In the embodiment of FIG. 6, the set of bumpers 100 for each wafer pocket 92 are arranged symmetrically about wafer carrier radial axis 95 corresponding to that wafer pocket 92, though it should be noted that in other embodiments bumpers 100 may be asymmetrically arranged relative to axis 95. In a related embodiment, regardless as to whether the set of bumpers 100 of each wafer pocket 92 are arranged symmetrically relative to wafer carrier radial axis 95, the angular orientation of each set of bumpers 100, as a whole, correspond to the angle of the wafer carrier radial axis 95 for that wafer pocket 92. In the embodiment shown, the set of bumpers 100 for each wafer pocket 92 are situated in the distal portion 102, opposite central axis 84, of wafer pocket 92 (i.e., on the side furthest from central axis 84).

Also, in this embodiment, each of bumpers 100 is located at a corresponding tab location 99, though not all tab locations 99 have a corresponding bumper 100. In various other embodiments, however, bumpers 100 may or may not be situated at a tab location 99. In one such embodiment, pocket 92 does not have any tabs 98 and thus lacks tab locations 99, although bumpers 100 are still utilized. In another embodiment, tabs 98 are present at corresponding tab locations 99, while one or more bumpers 100 are located at one or more corresponding points along the periphery of pocket 92 at one or more locations that do not coincide with tab locations 99.

In the embodiment depicted in FIG. 6, there is an even number of bumpers 100. In a related embodiment, the number of bumpers can be odd. For instance, in one such embodiment, a bumper 100 is included at the location indicated at 99', which is located along the wafer carrier radial axis 95 at the outer periphery of wafer pocket 92.

Bumpers 100a, 100b, and 11c are situated respectively along wafer pocket radial axes 86a, 86b, and 86c, all of which have an origin at wafer pocket center 85. Axis 86a is offset from wafer carrier radial axis 95 by angle a; axis 86b is offset from axis 95 by angle b; and axis 86c is offset from axis 95 by angle c as shown. Angles a, b, and c are progressively larger offsets from wafer carrier radial axis 95. In the embodiment depicted angle c-b is equal to angle b-a, which is equal to angle a. In other embodiments, however, these angles need not be equal.

According to one embodiment, bumpers 100 have varying sizes. In the present example, bumper 100a has a relatively larger amount of protrusion into the area of wafer pocket 92; bumper 100b is smaller (i.e., protrudes less) than bumper 100a; and bumper 100c is smaller still. In this embodiment, having smaller bumpers at relatively larger offset angles from wafer carrier radial axis 84 tends to prevent the undesired application of compression stress and frictional forces to the wafer during operation. Such stress can come about due to thermal expansion of the wafer, and due to centripetal forces having an inward-directed component (towards the center 85 of the pocket) as a result of bumpers being positioned at the offset angles a, b, and c. In the related embodiment in which a bumper is positioned at zero offset from the wafer carrier radial axis 95 (i.e., at location 99'), that bumper can have the largest relative size to other bumpers that are located at some offset angle.

More generally, in one type of embodiment, bumpers 100 are positioned and sized such that the risk of damaging the wafer during process conditions is reduced. According to one such example embodiment, bumpers with relatively smaller offset angles are generally larger (i.e., have a larger protrusion toward the center 85 of the pocket). In a related embodiment, considering the fact that the wafer-bumper interface corresponding to bumpers 100 which are offset from wafer carrier radial axis 95 experiences friction which, if overcome, results in stresses at the surface which can lead to crack formation, those bumpers which are at an offset angle greater than the angle of repose for that frictional system are designed to be relatively smaller than the bumpers at the smaller offset angles. Thus, in this embodiment the more distally-situated bumpers 100 are formed larger so as to provide a greater centripetal force.

Figure 8:
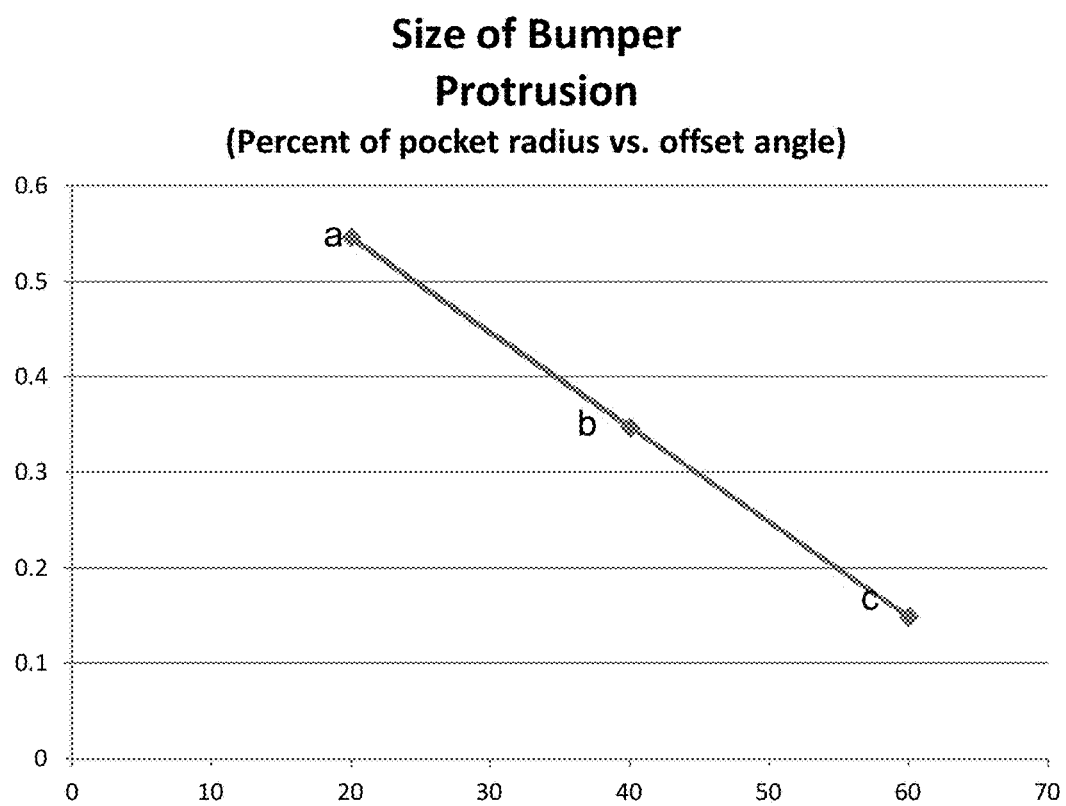
FIG. 8 is a graph illustrating the normalized size of bumper protrusion quantified as a percentage of pocket radius, versus the offset angle, according to one specific example embodiment.

FIG. 8 is a graph illustrating the normalized size of bumper protrusion for bumpers 100a, 100b, and 100c, quantified as a percentage of pocket radius, versus the offset angle according to one specific example embodiment. In this embodiment, bumpers 100a are positioned at a=20° and the amount of protrusion is 0.55%; bumpers 100b are positioned at b=40° and the amount of protrusion is 0.35%; and bumpers 100c, positioned at c=60°, protrude by 0.15%. It is contemplated that system designers may select various ratios of protrusion extent to pocket radius based on the design criteria of the wafer carrier and application. Greater protrusions provide more tightly-controlled gaps around the wafers; however, this comes at the expense of increased difficulty of handling the wafers. For example, applications utilizing thinner, more delicate, wafers may benefit from increased clearances around the wafer periphery according to a related embodiment.

Referring now to FIG. 9, a plan view is shown of bumper 100 and tab 98 according to one particular embodiment. Bumper 100 in this embodiment has a generally trapezoidal shape when viewed from above, though each of its edges as depicted are actually curves or arcs defined with at least one radius. For instance, angular surfaces 101 have a certain curvature selected to facilitate machining, or to provide certain mechanical properties. Practically, the shape of the bumpers 100 is dependent on both the machining capability as well as thermal and contact stress. In various embodiments, the bumper shape is designed to decrease these stresses sufficiently so as not to cause damage to either the wafer or the bumper. For example, rounded corners can be formed because they decrease both contact stress and thermal stress.

FIG. 10 is a cross-sectional view of the structure depicted in FIG. 9 taken along line 10-10. In this embodiment, the undercut peripheral wall of surface 105 is shown. In this embodiment, peripheral wall surface 105 has a greater inward protrusion at top end 106 than at bottom end 108. As shown in FIG. 10, the angle of the inward sloping surface 105 is about 10°. To further illustrate the relative positions of a structure in which the bumper and tab are situated at the same site according to one type of embodiment, FIG. 11 shows in perspective view the interior of wafer pocket 92 with inward protruding bumper 100 and tab 98.

Figure 12:
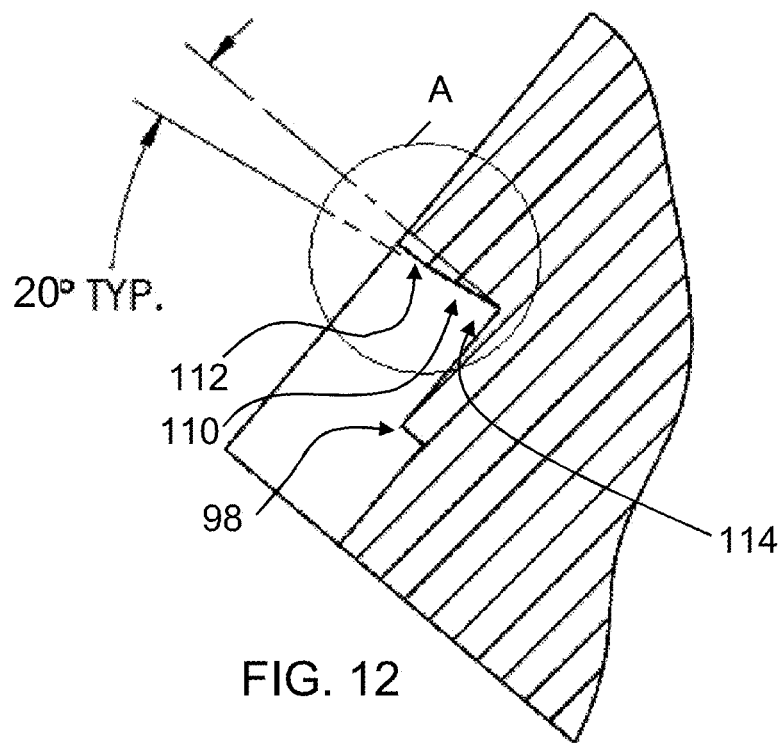
FIGS. 12 and 12A are cross-sectional views illustrating the profile of the peripheral wall surface of a bumper that interfaces with the edge of a wafer according to another embodiment.
Figure 12A:
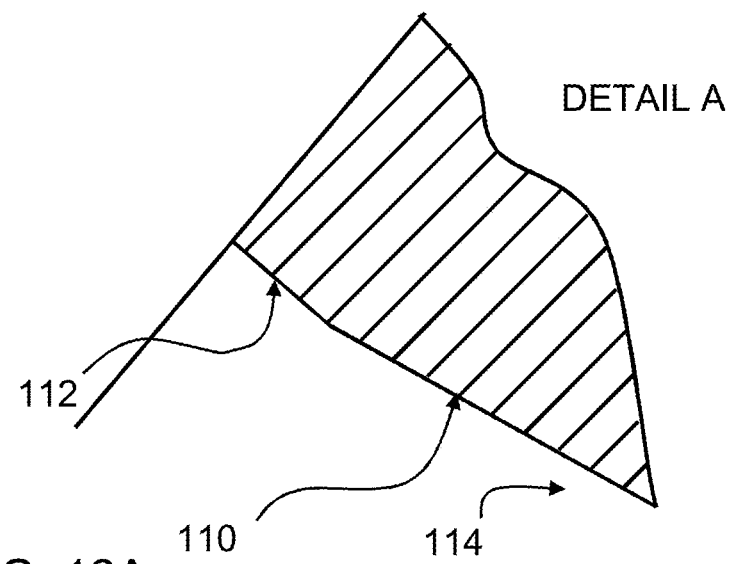

FIGS. 12 and 12A are cross-sectional views illustrating the profile of the peripheral wall surface of a bumper that interfaces with the edge of a wafer according to another embodiment. Similar features to those of the profile illustrated in FIG. 10 are similarly numbered. Detail A is shown in FIG. 12A. The peripheral wall profile is similar to peripheral wall surface 105 of the embodiment of FIG. 10 in that there is an inwardly-angled portion 110 creating an undercut 114. However, the peripheral wall profile of this embodiment differs from the embodiment of FIG. 10 in that the present embodiment includes a vertical portion 112 at the upper surface of the wafer carrier. In this particular embodiment, the angle of portion 110 is made larger, 20 degrees vs. 10 degrees, for a deeper undercut 114 per unit height. The undercut volume is utilized to provide space for the accumulation of coating material during fabrication of the wafer carrier, or for the accumulation of other matter. The space provided by undercut 114 is not beneath the wafer, which allows the accumulation without causing the edge of a wafer to be raised (which can result in ejection of the wafer from the pocket during processing).

Figure 13:
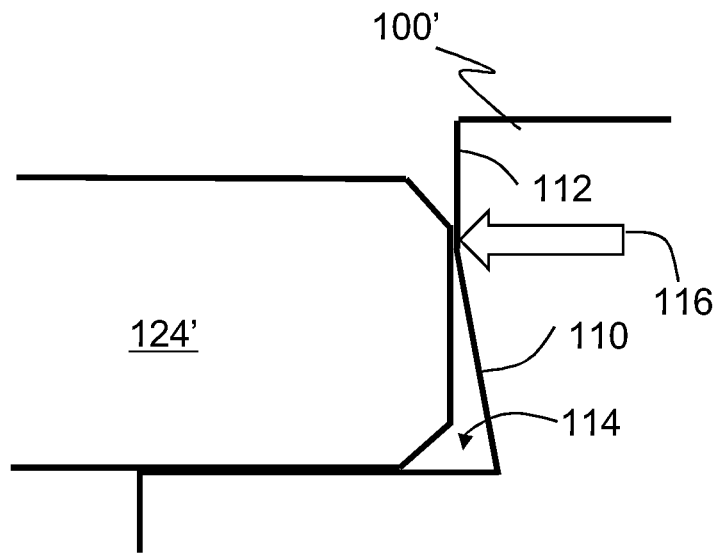
FIG. 13 is a schematic diagram illustrating the functionality of the embodiment of FIGS. 12 and 12A.

FIG. 13 is a schematic diagram illustrating the functionality of the embodiment of FIGS. 12 and 12A. Wafer 124', shown here as having beveled corners, experiences a centripetal force applied by bumper 100' against its edge due to the centripetal force from rotation of the wafer carrier. The contact points between wafer 124' and bumper 100' according to this embodiment are at only the interface of vertical portion 112 and the vertical edge of wafer 124' as shown. Centripetal force 116, is therefore only in the horizontal direction. Since centripetal force 116 has no downward component (as would be the case with the embodiment of FIG. 10), stress on the wafer is reduced, thereby avoiding cracking and shattering of the wafer or damage to bumper 100'. Similarly, any forces at the wafer-bumper interface due to differential thermal expansion of the wafer carrier pocket material and wafer material are in the horizontal direction, thereby avoiding undue stresses having an orthogonal component. As depicted in FIG. 13, the contact interface of bumper 100' and wafer 124' is located towards the top end of wafer 124'. During processing, this feature works with the applied centripetal force to apply a moment to urge wafer 124' downward towards the floor of the wafer pocket.

Figure 14:
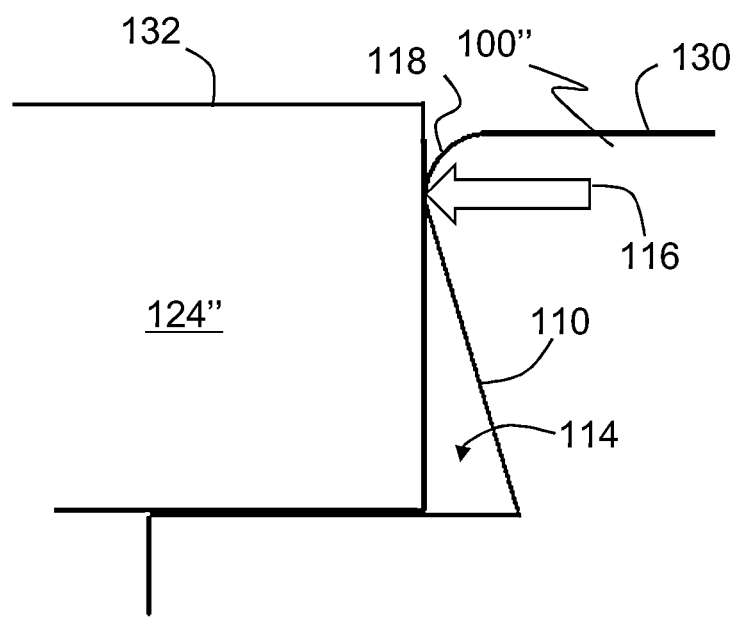
FIG. 14 is a schematic diagram illustrating a related example of a profile of a peripheral surface for bumper according to one embodiment.

FIG. 14 is a schematic diagram illustrating a similar embodiment of a profile of a peripheral surface for bumper 100". Bumper 100" differs from bumper 100' in that the upper portion 118 of the peripheral wall surface has a rounded corner rather than a straight portion 112. The edge of the wafer contacting the rounded upper portion 118 makes its contact tangentially, where the tangent is vertical. This embodiment also demonstrates that the upper surface 130 of bumper 100" can be higher than the top surface 132 of wafer 124". In this embodiment, like in the embodiment of FIG. 13, there is no vertical force component for the centripetal force or due to differential thermal expansion.

Figures 15A, 15B, 15C:
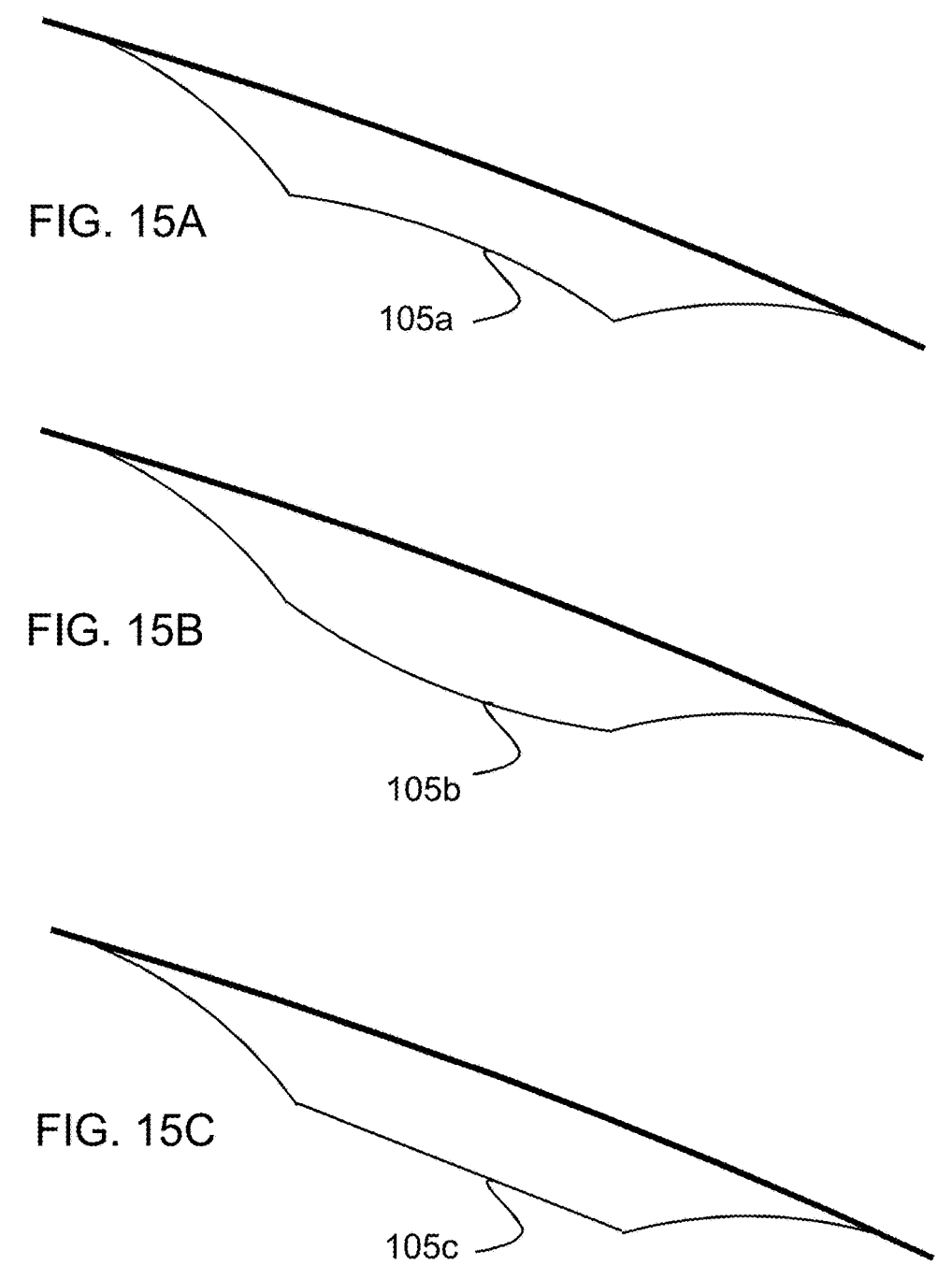

FIGS. 15A-15C are top-view diagrams illustrating various peripheral surface profiles that can be used for bumpers according to various embodiments. In FIG. 15A, peripheral surface 105a has a generally concave form, which may have a curvature corresponding to that of the wafer. This approach provides many contact points. In a related embodiment, the bumper with such a profile is formed from the same material from which the wafer is formed. This provides a matching thermal expansion to maintain matching curvatures and maintains the same contact points over a range of temperatures.

FIG. 15B illustrates a bumper according to another embodiment in which peripheral surface 105b is convex. The radius of curvature of the convex profile is preferably chosen such that the stress applied to the wafer by centripetal force is well within a suitable limit. Assumptions based on Hertzian contact mechanics for cylinder-to-cylinder contact may be utilized. FIG. 15C illustrates yet another embodiment in which peripheral surface 105c is straight.

The embodiments above are intended to be illustrative and not limiting. Other variations are contemplated to fall within the claims. For example, although the wafer carrier described above had a plurality of pockets, it is contemplated that in another embodiment a single-wafer carrier with one single pocket can benefit from use of the bumpers, or the bumpers and tabs in order to keep the single wafer centered during processing. In addition, although aspects of the present invention have been described with reference to particular embodiments, those skilled in the art will recognize that changes can be made in form and detail without departing from the scope of the invention, as defined by the claims. Thus, for example, the bumpers may be integrally formed with the wafer carrier or, alternatively, fabricated separately from the wafer carrier, and affixed to the wafer carrier.

Persons of ordinary skill in the relevant arts will recognize that the invention may comprise fewer features than illustrated in any individual embodiment described above. Thus, for instance, a wafer carrier having bumpers can be constructed without tabs, in which case the bumpers would have a height extending the full depth of the wafer pocket. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A wafer carrier for use in a system for growing epitaxial layers on one or more wafers by chemical vapor deposition (CVD), the wafer carrier comprising:
  a body formed symmetrically about a central axis, and including a generally planar top surface that is situated perpendicularly to the central axis;
  a plurality of wafer retention pockets recessed in the body from the top surface, each wafer retention pocket spaced from the central axis along a corresponding primary radial axis extending from the central axis through and radially bisecting that wafer retention pocket, each of the wafer retention pockets including:
    a floor surface generally parallel to the top surface;
    a peripheral wall surface adjacent to and surrounding the floor surface, the peripheral wall surface defining a periphery of each wafer retention pocket; and
    a secondary wafer pocket radial axis arranged perpendicular to both the central axis and the primary radial axis corresponding to that wafer retention pocket to bisect the wafer retention pocket into a proximal portion and a distal portion, wherein the proximal portion is relatively closer to the central axis and the distal portion is relatively further from the central axis;
  a plurality of bumpers positioned along the peripheral wall surface, wherein a majority of the plurality of bumpers are arranged entirely within the distal portion, the amount of protrusion of each bumper of the majority of the plurality of bumpers from the peripheral wall surface increasing the more distally situated each bumper is within the distal portion, and wherein each of the plurality of bumpers is configured to maintain a gap between the peripheral wall surface and the circular wafer.

2. The wafer carrier of claim 1, wherein each of the bumpers and each of the corresponding tabs protrude from the peripheral wall surface generally toward the pocket center.

3. The wafer carrier of claim 1, wherein in each plurality of bumpers of each wafer retention pocket, bumpers positioned relatively further from the central axis are configured to provide a relatively larger predefined size of the gap.

4. The wafer carrier of claim 1, wherein each of the wafer retention pockets has a generally cylindrical shape such that the peripheral wall surface is generally cylindrical.

5. The wafer carrier of claim 1, wherein the plurality of bumpers for each wafer retention pocket is symmetrically arranged about the primary radial axis corresponding to that wafer retention pocket.

6. The wafer carrier of claim 1, wherein all of the plurality of bumpers for each of the wafer retention pockets is arranged entirely within the distal portion.

7. The wafer carrier of claim 1, wherein at least a portion of the peripheral wall surface of each of the wafer retention pockets slopes inwards.

8. The wafer carrier of claim 1, wherein each of the bumpers is formed as a first generally trapezoidal shape having curved surfaces, and each of the tabs is formed as a second generally trapezoidal shape that is larger than the first generally trapezoidal shape.

9. The wafer carrier of claim 1, wherein each of the bumpers in each of the wafer retention pockets includes an interface surface that faces the pocket center and is adapted to contact the corresponding peripheral edge of a wafer during operation of the system for growing epitaxial layers.

10. The wafer carrier of claim 9, wherein the interface surface of each of the bumpers has a concave curvature in a plane parallel to the top surface, the concave curvature corresponding to a curvature of an edge of a wafer to be placed in the wafer retention pocket.

11. The wafer carrier of claim 9, wherein the interface surface of each of the bumpers has a convex curvature in a plane parallel to the top surface.

12. The wafer carrier of claim 9, wherein the interface surface of each of the bumpers includes an inwardly sloping portion such that a top end of the interface surface protrudes inward further than a bottom end of the interface surface.

13. The wafer carrier of claim 12, wherein the interface surface of each of the bumpers includes a contact portion that is positioned to be a sole contact surface against the peripheral edge of the wafer during operation such that a centripetal force applied to the wafer has substantially only a horizontal component.

14. The wafer carrier of claim 1, wherein the plurality of bumpers for each of the wafer retention pockets includes bumpers of varying sizes.

15. The wafer carrier of claim 14, wherein among the bumpers of varying sizes in each of the wafer retention pockets, those bumpers which are situated closer to the primary radial axis corresponding to each respective wafer retention pocket have a greater inward protrusion than bumpers situated farther from the primary radial axis in that wafer retention pocket.

16. The wafer carrier of claim 1, wherein the plurality of bumpers for each of the wafer retention pockets includes bumpers situated at offset angles of ±20°, ±40° and ±60°, wherein the offset angles are defined as the angle formed in a plane parallel to the top surface between the corresponding primary radial axis and a tertiary wafer pocket radial axis that is defined as having an origin at the pocket center and running to a center of a corresponding bumper.

17. The wafer carrier of claim 1, wherein each of the plurality of tabs has a recessed tab surface parallel to the top surface and recessed from the top surface, the tab surface being less recessed than the floor surface, wherein the plurality of tabs are arranged to maintain a space between the floor surface and a bottom surface of the wafer to be placed in the wafer retention pocket.

18. The wafer carrier of claim 17, wherein each tab of the plurality of tabs in each of the wafer retention pockets is located at a corresponding tab location along the peripheral wall surface, and wherein each of the bumpers of that wafer retention pocket is located at one of the tab locations.

19. A wafer carrier for use in a system for growing epitaxial layers on one or more wafers by chemical vapor deposition (CVD), the wafer carrier comprising:
 a body formed symmetrically about a central axis, and including a generally planar top surface that is situated perpendicularly to the central axis;
 a plurality of wafer retention pockets recessed in the body from the top surface, each of the wafer retention pockets spaced from the central axis along a corresponding primary radial axis extending from the central axis through and radially bisecting that wafer retention pocket, each of the wafer retention pockets including:
  a floor surface generally parallel to the top surface;
  a peripheral wall surface adjacent to and surrounding the floor surface, the peripheral wall surface defining a periphery of that wafer retention pocket; and
  a secondary wafer pocket radial axis arranged perpendicular to both the central axis and the primary radial axis corresponding to that wafer retention pocket to bisect the wafer retention pocket into a proximal portion and a distal portion, wherein the proximal portion is relatively closer to the central axis and the distal portion is relatively further from the central axis;
 wherein each wafer retention pocket has a pocket center at the intersection of the primary radial axis and the secondary wafer pocket radial axis; and
 a plurality of bumpers is positioned at the peripheral wall surface, wherein a majority of the plurality of bumpers are arranged entirely within of the distal portion, the amount of protrusion of each bumper of the majority of the plurality of bumpers from the peripheral wall surface increasing the more distally situated each bumper is within the distal portion, and each of the bumpers in each of the wafer retention pockets includes an interface surface that faces inward towards the pocket center, the interface surface including an inwardly sloping portion having a top end that protrudes inward further than a bottom end of the interface surface, the plurality of bumpers configured to maintain a gap between the peripheral wall surface and a circular wafer positioned therein to prevent contact therebetween;
 a tab corresponding to each one of the plurality of bumpers, wherein each of the tabs is configured to support the circular wafer positioned in the wafer retention pocket and space the circular wafer apart from the floor surface; and wherein the interface surface of each of the bumpers includes a contact portion that faces towards the central axis.

20. The wafer carrier of claim 19, wherein each of the bumpers protrudes from the peripheral wall surface generally toward the pocket center.

21. The wafer carrier of claim 19, wherein in each plurality of bumpers of each wafer retention pocket, bumpers positioned in the distal portion are configured to provide a relatively larger predefined size of the gap.

22. The wafer carrier of claim 19, wherein the entire plurality of bumpers for each of the wafer retention pockets is arranged entirely within the distal portion.

23. The wafer carrier of claim 19, wherein each of the bumpers is formed as a first generally trapezoidal shape having curved surfaces, and each of the tabs is formed as a second generally trapezoidal shape that is larger than the first generally trapezoidal shape.

24. The wafer carrier of claim 19, wherein the interface surface of each of the bumpers has a concave curvature in a plane parallel to the top surface, the concave curvature corresponding to a curvature of an edge of a wafer to be placed in the wafer retention pocket.

25. The wafer carrier of claim 19, wherein the interface surface of each of the bumpers has a convex curvature in a plane parallel to the top surface.

26. The wafer carrier of claim 19, wherein the plurality of bumpers for each of the wafer retention pockets includes bumpers of varying sizes, and wherein those bumpers which are situated closer to the primary radial axis corresponding to each respective wafer retention pocket have a greater inward protrusion than bumpers situated farther from the primary radial axis of that wafer retention pocket.

27. The wafer carrier of claim 19, wherein the contact portion of the interface surface includes a vertical surface oriented perpendicularly to the top surface.

28. The wafer carrier of claim 19, wherein the contact portion of the interface surface includes a rounded surface arranged to make tangential contact with an edge of the wafer during operation.

29. The wafer carrier of claim 19, wherein each of the plurality of tabs has a recessed tab surface parallel to the top surface and recessed from the top surface, the tab surface being less recessed than the floor surface, wherein the plurality of tabs are arranged to maintain a space between the floor surface and a bottom surface of the wafer to be placed in the wafer retention pocket.

30. The wafer carrier of claim 29, wherein each tab of the plurality of tabs in each of the wafer retention pockets is located at a corresponding tab location along the peripheral wall surface, and wherein each of the bumpers of that wafer retention pocket is located at one of the tab locations.

31. Apparatus for growing epitaxial layers on one or more wafers by chemical vapor deposition (CVD), comprising:
a reaction chamber;
a rotatable spindle having an upper end disposed inside the reaction chamber;
a wafer carrier for transporting and providing a support for the one or more wafers, the wafer carrier being centrally and detachably mounted on the upper end of the spindle and being in contact therewith at least in the course of a CVD process; and
a radiant heating element disposed under the wafer carrier for heating thereof;
wherein the wafer carrier comprises:
a body formed symmetrically about a central axis, and including a generally planar top surface that is situated perpendicularly to the central axis;
a plurality of wafer retention pockets recessed in the body from the top surface, each of the wafer retention pockets spaced from the central axis along a corresponding primary radial axis extending from the central axis through and radially bisecting that wafer retention pocket, each of the wafer retention pockets including:
a floor surface generally parallel to the top surface;
a peripheral wall surface surrounding the floor surface and defining a periphery of that wafer retention pocket; and
a secondary wafer pocket radial axis arranged perpendicular to both the central axis and the primary radial axis corresponding to that wafer retention pocket that bisects the wafer retention pocket into a proximal portion and a distal portion, wherein the proximal portion is relatively closer to the central axis and the distal portion is relatively further from the central axis;
wherein each wafer retention pocket has a pocket center situated along a corresponding wafer carrier radial axis that is perpendicular to the central axis; and
a plurality of bumpers positioned along the peripheral wall surface, wherein a majority of the plurality of bumpers are arranged entirely within the distal portion, the amount of protrusion of each bumper of the majority of the plurality of bumpers from the peripheral wall surface increasing the more distally situated each bumper is within the distal portion, and the bumpers of each plurality of bumpers have a variety of dimensional configurations, and the plurality of bumpers are configured to maintain a gap between the peripheral wall surface and a circular wafer positioned therein to prevent contact therebetween
in each of the wafer retention pockets, a tab corresponding to each one of the plurality of bumpers, wherein each of the tabs is configured to support the circular wafer positioned in the wafer retention pocket and space the circular wafer apart from the floor surface.

32. An apparatus for growing epitaxial layers on one or more wafers by chemical vapor deposition (CVD), the apparatus comprising:
a reaction chamber;
a rotatable spindle having an upper end disposed inside the reaction chamber;
a wafer carrier for transporting and providing a support for the one or more wafers, the wafer carrier being centrally and detachably mounted on the upper end of the spindle and being in contact therewith at least in the course of a CVD process; and
a radiant heating element disposed under the wafer carrier for heating thereof;
wherein the wafer carrier comprises:
a body formed symmetrically about a central axis, and including a generally planar top surface that is situated perpendicularly to the central axis;
a plurality of wafer retention pockets recessed in the body from the top surface, each of the wafer retention pockets spaced from the central axis along a corresponding primary radial axis extending from the central axis through and radially bisecting that wafer retention pocket, each of the wafer retention pockets including:
- a floor surface generally parallel to the top surface;
- a peripheral wall surface adjacent to and surrounding the floor surface and defining a periphery of that wafer retention pocket; and
- a secondary wafer pocket radial axis arranged perpendicular to both the central axis and the primary radial axis corresponding to that wafer retention pocket that bisects the wafer retention pocket into a proximal portion and a distal portion, wherein the proximal portion is relatively closer to the central axis and the distal portion is relatively further from the central axis;

wherein each wafer retention pocket has a pocket center situated along a corresponding wafer carrier radial axis that is perpendicular to the central axis; and a plurality of bumpers positioned along the peripheral wall surface, wherein a majority of the plurality of bumpers are arranged entirely within the distal portion, the amount of protrusion of each bumper of the majority of the plurality of bumpers from the peripheral wall surface increasing the more distally situated each bumper is within the distal portion, and wherein each of the bumpers in each of the wafer retention pockets includes an interface surface that faces inward towards the pocket center, the interface surface including an inwardly sloping portion having a top end that protrudes inward further than a bottom end of the interface surface;

in each of the wafer retention pockets, a tab corresponding to each of the plurality of bumpers, wherein each of the tabs is configured to support the circular wafer positioned in the wafer retention pocket and space the circular wafer apart from the floor surface; and wherein the interface surface of each of the bumpers includes a contact portion that faces towards the central axis, and the plurality of bumpers are configured to maintain a gap between the peripheral wall surface and a circular wafer positioned therein to prevent contact therebetween.

* * * * *

UNITED STATES PATENT AND TRADEMARK OFFICE
CERTIFICATE OF CORRECTION

| | | |
|---|---|---|
| PATENT NO. | : 10,316,412 B2 | Page 1 of 1 |
| APPLICATION NO. | : 13/450062 | |
| DATED | : June 11, 2019 | |
| INVENTOR(S) | : Krishnan et al. | |

It is certified that error appears in the above-identified patent and that said Letters Patent is hereby corrected as shown below:

On the Title Page

After (54) and in the Specification Column 1, Line 1 please delete "WAFTER CARRIER FOR CHEMICAL VAPOR DEPOSITION SYSTEMS" and insert in its place --WAFER CARRIER FOR CHEMICAL VAPOR DEPOSITION SYSTEMS--.

Signed and Sealed this
Eighteenth Day of August, 2020

Andrei Iancu
*Director of the United States Patent and Trademark Office*